US008624297B2

(12) United States Patent
Chun et al.

(10) Patent No.: US 8,624,297 B2
(45) Date of Patent: Jan. 7, 2014

(54) MULTI-LAYER CIRCUIT SUBSTRATE FABRICATION AND DESIGN METHODS PROVIDING IMPROVED TRANSMISSION LINE INTEGRITY AND INCREASED ROUTING DENSITY

(75) Inventors: Sungjun Chun, Austin, TX (US);
Anand Haridass, Austin, TX (US);
Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1108 days.

(21) Appl. No.: 12/579,517

(22) Filed: Oct. 15, 2009

(65) Prior Publication Data

US 2010/0035426 A1 Feb. 11, 2010

Related U.S. Application Data

(62) Division of application No. 11/751,786, filed on May 22, 7, now Pat. No. 7,646,082.

(51) Int. Cl.
*H01L 27/10* (2006.01)
*H01L 21/4763* (2006.01)

(52) U.S. Cl.
USPC ............................. 257/207; 257/664; 438/637

(58) Field of Classification Search
USPC .......... 438/128, 129, 637; 257/E21.575, 207, 257/208, 664, 691, 778; 716/115, 137, 139
See application file for complete search history.

(56) References Cited

U.S. PATENT DOCUMENTS

| | | | |
|---|---|---|---|
| 6,339,197 B1 | 1/2002 | Fushie et al. | |
| 6,353,917 B1 | 3/2002 | Muddu et al. | |
| 6,506,982 B1 | 1/2003 | Shigi et al. | |
| 6,581,195 B2 | 6/2003 | Tanaka | |
| 6,762,489 B2 | 7/2004 | Daves et al. | |
| 6,769,102 B2 | 7/2004 | Frank et al. | |
| 6,922,822 B2 * | 7/2005 | Frank et al. | 716/112 |
| 6,938,336 B2 | 9/2005 | Ito et al. | |
| 6,993,739 B2 | 1/2006 | Becker et al. | |
| 7,017,128 B2 | 3/2006 | Audet et al. | |
| 7,045,719 B1 * | 5/2006 | Alexander et al. | 174/262 |
| 7,084,355 B2 | 8/2006 | Kosaka et al. | |
| 7,129,574 B2 | 10/2006 | Wu | |

(Continued)

OTHER PUBLICATIONS

U.S. Appl. No. 12/021,363, filed Jan. 29, 2008, Christo, et al.
U.S. Appl. No. 11/829,179, filed Jul. 27, 2007, Douriet, et al.
Hubing, et al., "Identifying and Quantifying Print Circuit Board Inductance", Aug. 1994, IEEE International Symposium on Electromagnetic Compatibility, Symposium Record, pp. 205-208.

(Continued)

*Primary Examiner* — Hung Vu
(74) *Attorney, Agent, or Firm* — Mitch Harris, Atty at Law, LLC; Andrew M. Harris; Matthew B. Talpis

(57) ABSTRACT

An integrated circuit substrate is designed and fabricated with a selectively applied transmission line reference plane metal layer to achieve signal path shielding and isolation, while avoiding drops in impedance due to capacitance between large diameter vias and the transmission line reference plane metal layer. The transmission line reference plane defines voids above (or below) the signal-bearing plated-through holes (PTHs) that pass through a rigid substrate core, so that the signals are not degraded by an impedance mismatch that would otherwise be caused by shunt capacitance from the top (or bottom) of the signal-bearing PTHs to the transmission line reference plane. For voltage-plane bearing PTHs, no voids are introduced, so that signal path conductors can be routed above or adjacent to the voltage-plane bearing PTHs, with the transmission line reference plane preventing shunt capacitance between the signal path conductors and the PTHs.

9 Claims, 7 Drawing Sheets

(56) References Cited

U.S. PATENT DOCUMENTS

| | | |
|---|---|---|
| 7,197,736 B2 | 3/2007 | Saxena et al. |
| 7,240,309 B2 | 7/2007 | Saito et al. |
| 7,272,809 B2 | 9/2007 | Becker et al. |
| 7,646,082 B2 | 1/2010 | Chun et al. |
| 7,765,504 B2 | 7/2010 | Douriet et al. |
| 2004/0238942 A1 | 12/2004 | Chakravorty et al. |
| 2005/0017357 A1 | 1/2005 | Iida et al. |
| 2009/0193380 A1 | 7/2009 | McElvain et al. |

OTHER PUBLICATIONS

Chen, et al., "Via and Return Path Discontinuity Impact to High Speed Digital Signal Quality", Oct. 2000, IEEE Conference on Electrical Performance of Electronic Packaging, Digest, pp. 215-218.

Pak, et al. "Prediction and Verification of Power/Ground Plane Edge Radiation Excited by Through-Hole Signal Via Based on Balanced TLM and Via Coupling Model", Oct. 2003 IEEE Conference on Electrical Performance of Electronic Packaging, pp. 181-184.

* cited by examiner

MULTI-LAYER CIRCUIT SUBSTRATE FABRICATION AND DESIGN METHODS PROVIDING IMPROVED TRANSMISSION LINE INTEGRITY AND INCREASED ROUTING DENSITY

The present U.S. Patent Application is a Division of U.S. patent application Ser. No. 11/751,786, filed on May 22, 2007 now U.S. Pat. No. 7,646,082.

BACKGROUND OF THE INVENTION

1. Field of the Invention

The present invention relates generally to integrated circuit internal package interconnects, and more particularly, to a methodology and multi-layer substrate that has improved signal integrity and impedance matching.

2. Description of Related Art

High-density interconnect schemes for processor packages, as well as other very-large-scale integrated (VLSI) circuits typically use a large number of circuit layers to connect one or more dies to electrical terminals disposed on one or more surfaces of the package, as well as to interconnect multiple dies in multi-die packages.

A typical stack-up for a present-day VLSI circuit substrate is fabricated in very thin layers on one or both sides of a rigid core that provides stiffness and stability to integrated circuit substrates, which may then be encapsulated after dies are attached. The core typically includes pass-through vias that have a larger diameter than the vias used between the thin circuit layers and that pass between thin insulating layers. For example, in a substrate having a core 800 μm thick, the diameter of the through vias may be 500 μm in diameter, while the outer layer interconnects may have vias only 50 μm in diameter. The reason for the larger diameter holes through the core is the relative thickness of the core, which makes reliable fabrication and resin/conductive filling of the vias more difficult than for vias between the thin insulating layers in the outer circuit layers that are laminated on the core.

Since the interconnect routing density directly determines the required size of the final package, routing resources are critical in an integrated circuit package and space is at a premium. However, for critical signal paths such as clock and high-speed logic signal distribution, transmission lines must be maintained throughout the signal path in order to prevent signal degradation. Therefore, a reference voltage plane (e.g., ground) metal layer is provided on the surface of the core, with voids around the via and interconnect areas at the surface(s) of the core so that a transmission line is provided for the next signal layer above/below the core surface metal layer(s). As a result, signal path conductors must be routed around the large diameter vias passing through the core which are not connected to the metal layer. Further, the signal path conductors must also be routed away from discontinuities in the metal layers(s) caused by the voids through which the vias pass, since the lack of reference voltage plane metal will cause a change in impedance of the transmission line. Therefore, the number of signal routing channels is severely limited by the presence of the large-diameter vias that extend through the core that provide signal paths, and the large-diameter vias that provide voltage planes other than the voltage plane connected to the core surface metal layer.

It is therefore desirable to provide a multi-layer integrated circuit, substrate and method that maintain signal integrity and impedance matching in an integrated circuit package while providing an increased amount of signal routing channels.

BRIEF SUMMARY OF THE INVENTION

The objective of improving signal integrity and impedance matching in a multi-layer integrated circuit substrate is provided in an integrated circuit substrate, and methods for making and designing the integrated circuit substrate.

The substrate includes a core having large diameter vias and at least one signal layer having signal conductors having a width substantially smaller than the diameter of the large diameter vias. The signal conductors are connected to large diameter vias by a small diameter portion passing through a first insulating layer disposed between the core and a transmission line reference plane metal layer, and a second insulating layer disposed between the transmission line reference plane metal layer and the signal layer.

The transmission line reference plane metal layer defines voids having an area larger than the area of signal-bearing large diameter vias, so that the presence of the transmission line reference plane metal layer does not cause substantial insertion capacitance with respect to critical signals. Metal is provided in the transmission line reference plane metal layer over large diameter vias that connect to power distribution (e.g., VDD and ground), other voltage planes such as reference voltages/returns, and non-critical signal paths resulting in improved transmission line impedance profile and an increased number of routing channels available above the transmission line reference plane metal layer.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION OF THE INVENTION

Figure 1:
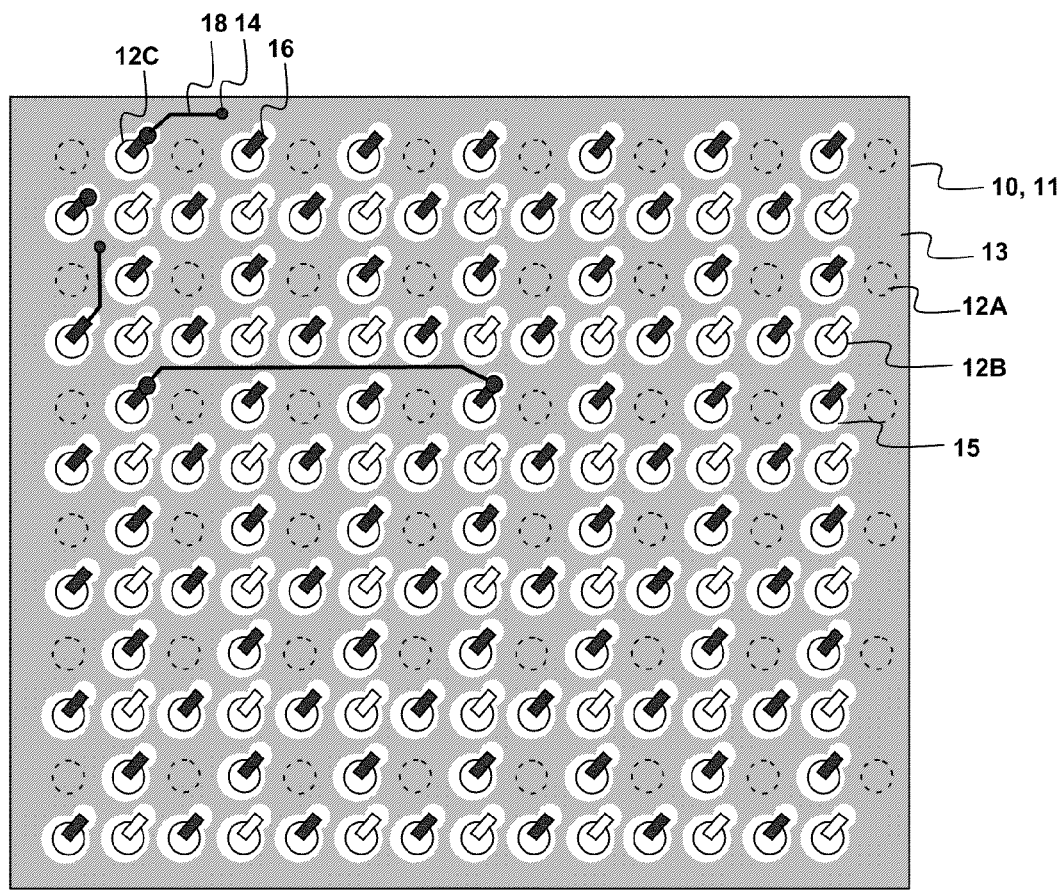
FIG. 1 is a top view of a Prior Art integrated circuit substrate.

The present invention concerns integrated circuit package substrates and methods of designing and making the substrates that solve impedance matching and isolation problems associated with prior art substrates. Referring now to FIG. 1, a top view of a prior art integrated circuit package substrate is shown. A core dielectric layer 10 is covered by a reference voltage plane (e.g., ground or other power distribution plane) metal layer 11 through which voids 15 are provided so that the tops of plated through vias 12B, 12C and interconnect "jog" conductor stubs 16 are electrically isolated from metal layer 11. An insulating layer 13 is disposed atop the metal layer 11 and signal conductors 18 are routed in routing channels atop insulating layer 13. Plated through reference voltage plane vias 12A are electrically connected to metal layer 11 and therefore have no voids disposed around their top ends. As illustrated, a very limited number of routing channels are available for signal conductors 18, as in order to form proper transmission lines, the signal conductors are routed over continuous portions of metal layer 11, including areas above the tops of reference voltage plane vias 12A. Small diameter vias 14 provide for connection of signal conductors 18 to upper layers laminated above the metal layer corresponding to signal paths 18.

Figure 2A:
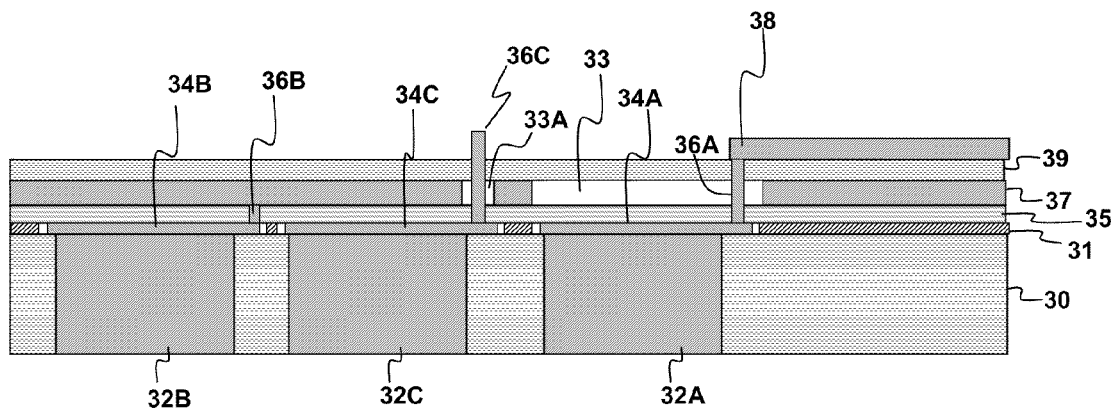
FIG. 2A is a cross-sectional view of a substrate in accordance with an embodiment of the present invention.

Referring now to FIG. 2A, an integrated circuit package substrate in accordance with an embodiment of the present invention is shown. The substrate includes a core 30 including through-via conductors provided by resin-filled plated-through hole (RFPs) 32A-32C. Metal layers are formed by plating, deposition or laminating on both sides of core 30 containing jog stubs 34A-34C and areas of reference voltage plane layer 31, with an insulating layer 35 laminated above stubs 34A-34C and reference voltage plane layer 31, similar to the substrate of FIG. 1. However, in the substrate of FIG. 2A, a transmission line reference plane metal layer 37 is laminated, or otherwise deposited, above insulating layer 35 and a second insulating layer 39 is laminated, or otherwise deposited, above transmission line reference plane metal layer 37. A signal layer including signal path conductors 38 that are laminated or otherwise deposited above insulating layer 39. For each critical signal-bearing RFP 32A, large-diameter voids 33 in transmission line reference plane metal layers 37 are provided above and below ends of signal-bearing RFPs 32A, which substantially eliminates the shunt capacitance from signal-bearing RFP 32A to transmission line reference plane metal layers 37. While large-diameter voids are devoid of metal, in practice, the voids will generally be filled with dielectric, lamination adhesive or other non-conductive material. Signal-bearing RFPs 32A are connected to signal path conductors 38 by stubs 34A and small-diameter vias 36A. Without large diameter voids 33, the shunt capacitance from the ends of signal-bearing RFP 32A to transmission line reference plane metal layers 37 will cause signal degradation. Voltage plane RFPs 32B and 32C (and optionally RFPs bearing non-critical signals) have no corresponding large-diameter voids in transmission line reference plane metal layer 37, which increases their distributed capacitance by the shunt capacitance from RFPs 32B,32C to transmission line reference plane metal layer 37, which is generally desirable.

Reference plane RFP 32B, which corresponds to the voltage plane to which transmission line reference plane metal layer 37 is connected, has a stub 34B connecting to transmission line reference plane metal layer 37 through a small via 36B. Blind vias connected to transmission line reference plane metal layer 37 can further be used in connections to signal path layers added above the layer containing signal conductors 38, to provide electrical connection to the particular voltage plane connected to transmission line reference plane metal layer 37, if needed. Therefore, no void is needed in transmission line reference plane metal layer 37 above reference plane RFP 32B. Other voltage plane RFPs 32C will generally require formation of vias 36C extending to other layers above transmission line reference plane metal layer 37 from stubs 34C. Small-diameter voids 33A provide connection to other voltage plane RFPs 32C and extend only above the ends of stubs 34C, for signal routing channels above transmission line reference plane metal layer 37 above the top ends (and beneath the bottom ends for layers applied beneath core 30, not specifically shown) of other voltage plane RFPs 32C. Thus, in contrast to the substrate of FIG. 1, the substrate of the present invention provides for routing of signal path conductors 38 in routing channels extending anywhere above reference plane RFPs 32B and other voltage plane RFPs 32C that were not available for routing signal path conductors in the substrate of FIG. 1. The voltage plane used to provide a reference to transmission line reference plane metal layer 37 may be a power supply voltage supplying the input/output drivers (the I/O signal reference and/or return voltage) or ground.

Figure 2B:
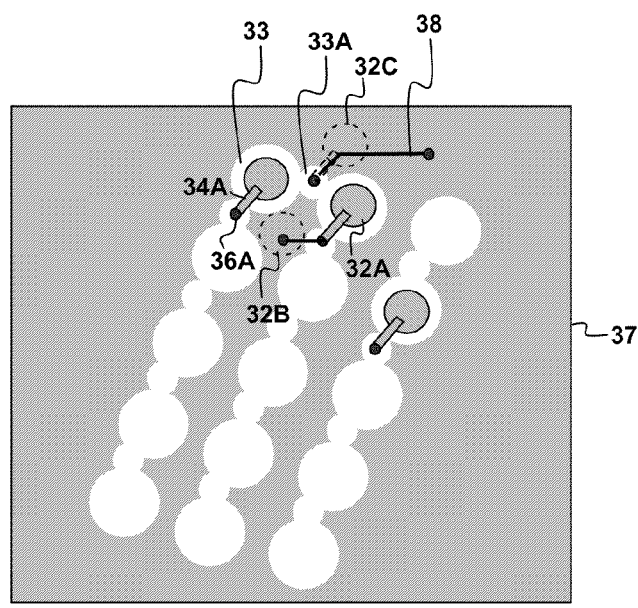
FIG. 2B is top view of the substrate of FIG. 2A.

Referring now to FIG. 2B, a top view of the integrated circuit package substrate of FIG. 2A is shown. Voids 33 are defined by transmission line reference plane metal layer 37, with additional metal removed above signal path stubs 34A and small diameter voids 33A for vias 36A that connect signal path stubs 34A to other signal layers. The resulting integrated circuit package substrate has improved isolation between signal path conductors 38 routed over the continuous portions of transmission line reference plane metal layer 37, while eliminating the shunt capacitance from signal-bearing RFPs 32A to metal layer 37. Increased routing channels are provided in the regions extending over the top ends (or bottom ends) of voltage plane RFPs 32B and 32C. Thus, the substrate of the present invention provides improved signal performance in signal paths, providing for higher processor or other VLSI circuit operating frequencies, while providing increased routing flexibility by providing more routing channels that can have full signal performance no matter whether signal paths are routed above core RFPs that carry power distribution and/or non-critical signals.

Figure 3:
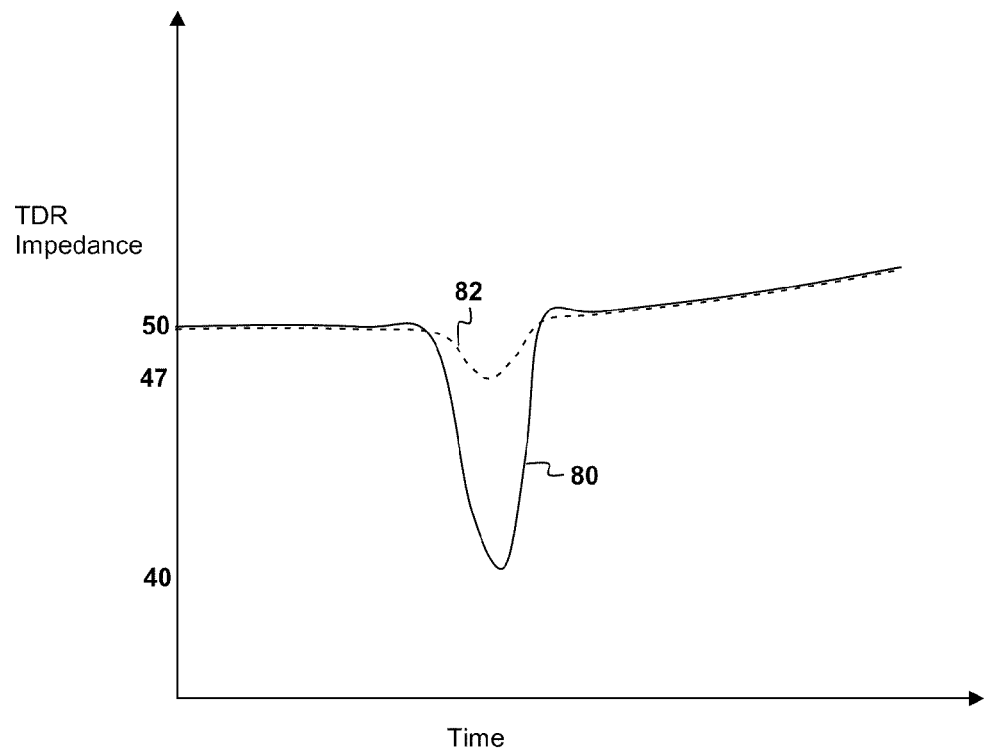
FIG. 3 is a graph depicting an expected time-domain reflectometer display depicting a performance improvement provided by the substrate of the present invention.

Referring now to FIG. 3, an expected time domain reflectometer (TDR) display illustrating the advantages of the present invention is shown. The solid line 80 depicts a reflectometer measurement of a signal path from a signal RFP extending to a signal path, such as signal path 18 of FIG. 1. The capacitance is estimated as 0.1 pF and results in an impedance drop from 50 ohms to approximately 41 ohms. The dashed line 82 represents a TDR display of the impedance from a signal RFP to a signal path such as signal path 38 of the substrate of FIGS. 2A-2B. The reduction in capacitance provided by the voids 33 in transmission line reference plane metal layer 37 above signal RFPs 32A and small-diameter vias 33A provide a reduction in the shunt capacitance and consequent reflection, keeping the transmission line impedance of the signal path above 47 ohms.

Figure 4A:
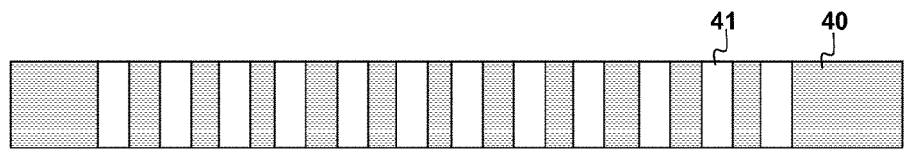
FIGS. 4A-4G are cross sectional views illustrating steps in the manufacture of a substrate in accordance with an embodiment of the present invention.
Figure 4B:
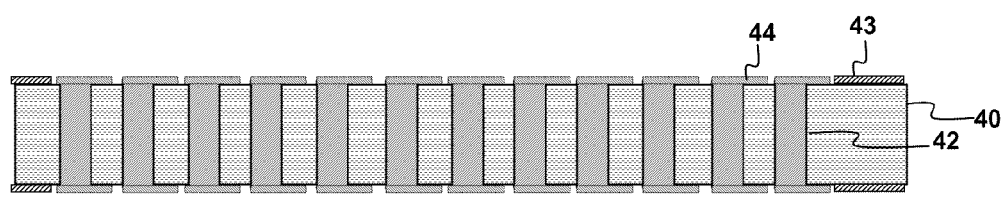
Figure 4C:
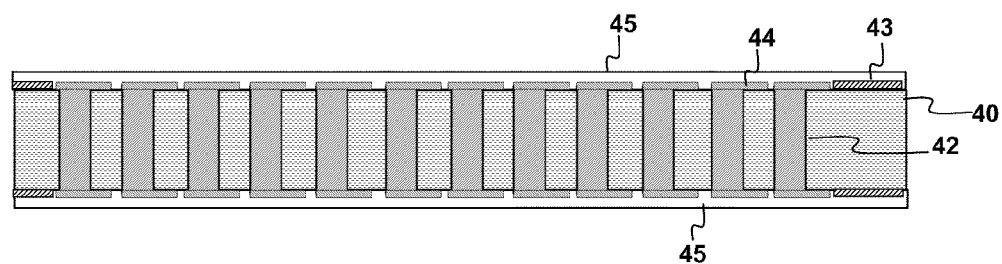
Figure 4D:
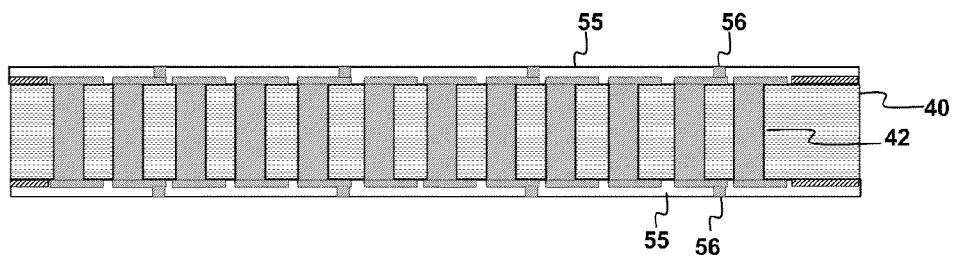
Figure 4E:
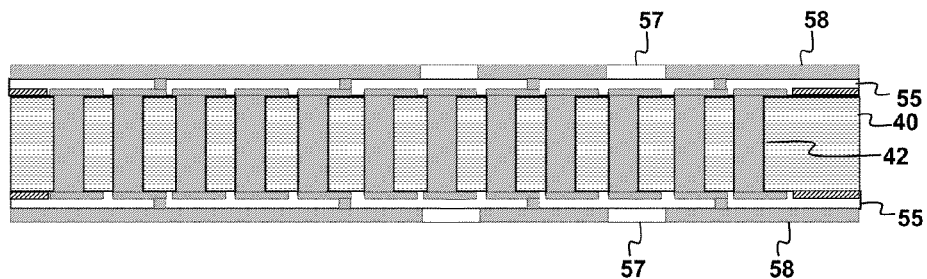
Figure 4F:
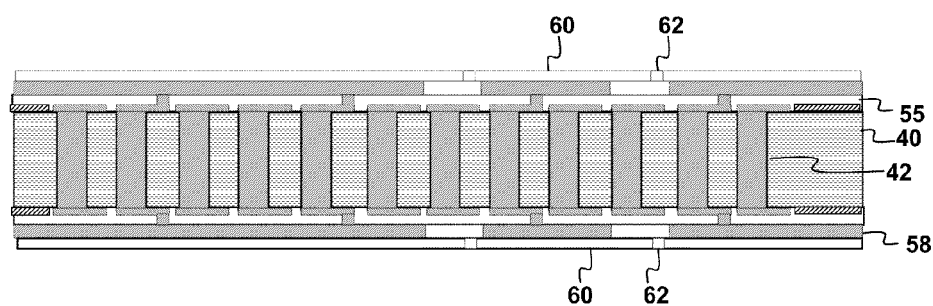
Figure 4G:
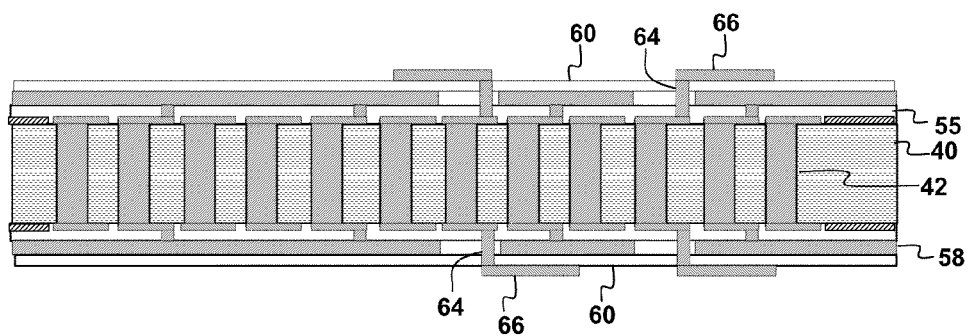

Referring now to FIGS. 4A-4G, a method of making an integrated circuit substrate and integrated circuit in accordance with an embodiment of the invention is shown. As shown in FIG. 4A, starting from a core dielectric layer 40 having via holes 41 formed therein, holes 41 are filled with resin/metal to form PTHs 42. Stubs 44 and reference plane areas 43 are formed on both surfaces of core 40, as shown in FIG. 4B. An insulating layer 45 is then applied to one or both sides of the core dielectric layer 40, over stubs 44 as shown in FIG. 4C. Next, insulating layer 45 is opened to generate small-diameter via holes, forming insulating layer 55. Then, metal is added in the small-diameter via holes to form small vias 56 to connect to voltage plane RFPs as shown in FIG. 4D. Next, a transmission line reference plane metal layer 58 with voids 57 is applied as shown in FIG. 4E. Voids 57, will generally be filled with dielectric insulating material or lamination adhesive as described above. Both the insulating layer 55 and transmission line reference plane metal layer 58 may be applied as laminates, or the insulating layer may be deposited and/or transmission line reference plane metal layer 58 may be plated atop insulating layer 55. Voids 57 may be pre-formed in transmission line reference plane metal layer 58 or etched. Next, as shown in FIG. 4F, another insulating layer 60 is applied in a manner similar to that for insulating layer 55, and small voids 62 are formed or pre-formed in insulating layer 60 for connection to signal RFPs. Finally, blind vias 64 and a signal layer 66 are formed as shown in FIG. 4G that provide electrical connection to signal RFPs. Blind vias 64 and signal layer 66 may be formed at the same time, for example, by plating, or blind vias 64 may be formed first by filling or plating and then signal layer 66 laminated or plated to connect to blind vias 64.

Figure 4H:
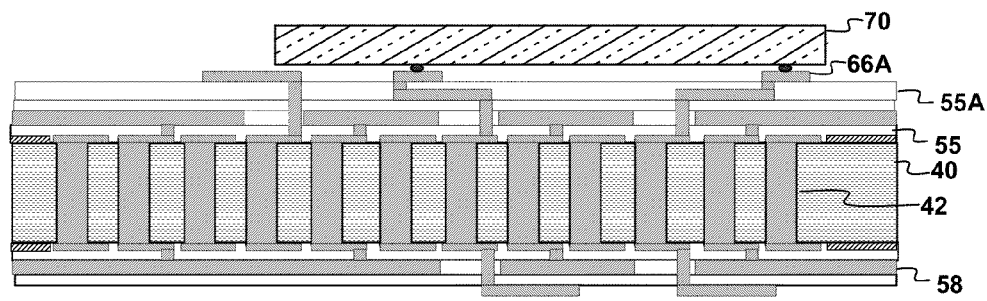
FIG. 4H is a cross sectional view of an integrated circuit package in accordance with an embodiment of the present invention.

Referring now to FIG. 4H, an integrated circuit in accordance with an embodiment of the present invention is shown. The substrate of FIG. 4G is further modified by adding further signal layers, and optionally voltage plane layers on one or both sides of the core dielectric layer 40. As illustrated another insulating layer 55A and signal layer 66A are added, but in practice, numerous other layers may be added. A semiconductor die 70 is attached to lands or other structures accessible from the top layer of the substrate shown in FIG. 4G and terminals or lands (not shown) may similarly be added to the bottom side of the substrate after other circuit layers are added. Alternatively, lands can be formed directly on the bottom side of core dielectric layer 40 or terminals may be attached to the bottom side of RFPs 42.

Figure 5:
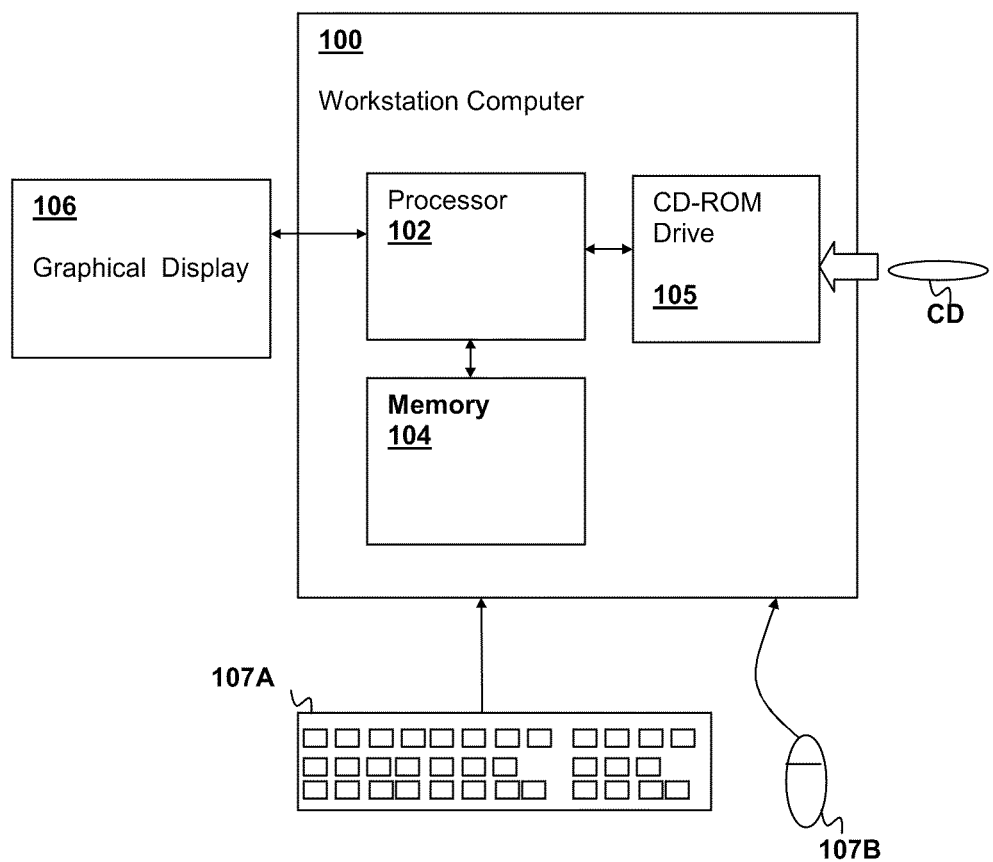
FIG. 5 is a pictorial diagram depicting a workstation computer system by which design methods and computer program products are executed in accordance with an embodiment of the present invention.

Referring now to FIG. 5, a workstation computer system 100 is shown in which the methods of the present invention are carried out in accordance with an embodiment of the present invention, according to program instructions that may be embodied in a computer program product in accordance with a present invention, for example program instructions stored on a CD-ROM disc CD. Workstation computer system includes a processor 102 for executing the program instructions coupled to a memory 104 for storing the program instructions, data and results used in designing integrated circuit substrates in accordance with embodiments of the present invention. Workstation computer system 100 also includes peripheral devices such as CD-ROM drive 105 for reading discs such as CD in order to load the program instructions into workstation computer 100. Input devices, such as a keyboard 107A and a mouse 107B are coupled to workstation computer system 100 for receiving user input. A graphical display 106 for displaying results such as the layout of metal layer 37 of FIGS. 2A-2B and simulations such as that of FIG. 3. The depicted workstation computer 100 is only exemplary and illustrates one type of computer system and arrangement suitable for carrying out the design methods of the present invention.

The design methods generally identify the locations of signal bearing vias and generate a mask design for a transmission line reference plane metal layer that includes voids around the profile of the signal-bearing vias so that capacitive coupling between the ends of the signal-bearing vias and the transmission line reference plane metal layer is substantially reduced.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method of designing layers of a substrate for mounting and interconnecting a semiconductor die, the method comprising:
    within a computer executing a program modeling a design of the substrate stored in a memory of the computer, identifying locations of signal bearing vias from among a pattern of large-diameter conductive vias extending from a top side to a bottom side of a core comprising a dielectric layer; and
    within the computer executing the program modeling the design of the substrate, generating a first mask design for a transmission line reference plane metal layer including regions substantially devoid of metal around the profile of the signal-bearing vias so that capacitive coupling between the ends of the signal-bearing vias and the transmission line reference plane metal layer is substantially reduced, whereby the design of the substrate stored in the memory is modified, and wherein the transmission line reference plane metal layer does not provide power distribution within the substrate.

2. The computer-performed method of claim 1, wherein the generating a first mask design generates a continuous fill of the design of the transmission line reference plane metal layer above the profile of voltage plane vias terminating on a voltage plane, whereby capacitive coupling between tops of the voltage plane vias and the transmission line reference plane metal layer is maximized.

3. The computer-performed method of claim 2, further comprising generating a second mask design for an insulating layer disposed between the transmission line reference plane metal layer and the core, including via holes above at least some of the voltage plane vias, whereby the transmission line reference plane metal layer is connected to the at least some voltage plane vias by metal deposited in the via holes.

4. A computer program product comprising storage media containing program instructions for execution by a processor for designing layers of a substrate for mounting and interconnecting a semiconductor die, the program instructions comprising program instructions for:
    identifying locations of signal bearing vias from among a pattern of large-diameter conductive vias extending from a top side to a bottom side of a core comprising a dielectric layer;
    generating a first mask design for a transmission line reference plane metal layer including regions substantially devoid of metal around the profile of the signal-bearing vias so that capacitive coupling between the ends of the signal-bearing vias and the transmission line reference plane metal layer is substantially reduced, and wherein the transmission line reference plane metal layer does not provide power distribution within the substrate.

5. The computer program product of claim 4, wherein the program instructions for generating a first mask design generate a continuous fill of the design of the transmission line reference plane metal layer above the profile of voltage plane vias terminating on a voltage plane, whereby capacitive coupling between tops of the voltage plane vias and the transmission line reference plane metal layer is maximized.

6. The computer program product of claim 5, wherein the program instructions further comprise program instructions for generating a second mask design for an insulating layer disposed between the transmission line reference plane metal layer and the core, including via holes above at least some of the voltage plane vias, whereby the transmission line reference plane metal layer is connected to the at least some voltage plane vias by metal deposited in the via holes.

7. A workstation computer system, comprising a processor for executing program instructions and a memory for storing the program instructions and data, wherein the program instructions include program instructions for designing layers of a substrate for mounting and interconnecting a semiconductor die, wherein the program instructions comprise program instructions for:

identifying locations of signal bearing vias from among a pattern of large-diameter conductive vias extending from a top side to a bottom side of a core comprising a dielectric layer;

generating a first mask design for a transmission line reference plane metal layer including regions substantially devoid of metal around the profile of the signal-bearing vias so that capacitive coupling between the ends of the signal-bearing vias and the transmission line reference plane metal layer is substantially reduced, and wherein the transmission line reference plane metal layer does not provide power distribution within the substrate.

8. The workstation computer system of claim 7, wherein the program instructions for generating a first mask design generate a continuous fill of the design of the transmission line reference plane metal layer above the profile of voltage plane vias terminating on a voltage plane, whereby capacitive coupling between tops of the voltage plane vias and the transmission line reference plane metal layer is maximized.

9. The workstation computer system of claim 8, wherein the program instructions further comprise program instructions for generating a second mask design for an insulating layer disposed between the transmission line reference plane metal layer and the core, including via holes above at least some of the voltage plane vias, whereby the transmission line reference plane metal layer is connected to the at least some voltage plane vias by metal deposited in the via holes.

* * * * *